United States Patent
Zhang et al.

(10) Patent No.: US 6,633,162 B2
(45) Date of Patent: Oct. 14, 2003

(54) SYSTEM AND METHOD FOR FILTERING FREQUENCY ENCODED IMAGING SIGNALS

(75) Inventors: James Nengjie Zhang, Waukesha, WI (US); Chris J. Gilling, Pewaukee, WI (US); Kevin Scott Kreger, Milwaukee, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 76 days.

(21) Appl. No.: 09/935,091

(22) Filed: Aug. 22, 2001

(65) Prior Publication Data

US 2003/0062901 A1 Apr. 3, 2003

(51) Int. Cl.[7] .................................................. G01V 3/00
(52) U.S. Cl. ....................................... 324/322; 324/309
(58) Field of Search ................................. 324/322, 318, 324/309, 307; 382/131, 106

(56) References Cited

U.S. PATENT DOCUMENTS

| | | | | |
|---|---|---|---|---|
| 4,684,891 A | * | 8/1987 | Feinberg | 324/309 |
| 4,952,877 A | | 8/1990 | Stormont et al. | 324/312 |
| 4,992,736 A | | 2/1991 | Stormont et al. | 324/309 |
| 5,276,614 A | * | 1/1994 | Heuscher | 382/260 |
| 5,841,473 A | * | 11/1998 | Chui et al. | 348/390.1 |
| 5,841,890 A | * | 11/1998 | Kraske | 382/131 |
| 5,974,159 A | * | 10/1999 | Lubin et al. | 382/106 |
| 6,046,591 A | | 4/2000 | King et al. | 324/309 |
| 6,137,904 A | * | 10/2000 | Lubin et al. | 382/162 |
| 6,144,772 A | * | 11/2000 | Garland et al. | 382/239 |
| 6,310,967 B1 | * | 10/2001 | Heine et al. | 382/128 |
| 6,360,022 B1 | * | 3/2002 | Lubin et al. | 382/260 |
| 6,445,182 B1 | * | 9/2002 | Dean et al. | 324/309 |

OTHER PUBLICATIONS

Ronald E. Crochiere et al., Multirate Digital Signal Processing, pp. 13–126.

* cited by examiner

Primary Examiner—Diego Gutierrez
Assistant Examiner—Dixomara Vargas
(74) Attorney, Agent, or Firm—Foley & Lardner; Peter J. Vogel; Michael A. Della Penna

(57) ABSTRACT

A method of filtering frequency encoded imaging signals includes receiving the frequency encoded imaging signals in the time domain and demodulating the frequency encoded imaging signals. The method further includes upsampling the frequency encoded imaging signals by an integer upsampling factor, reducing the bandwidth of the frequency encoded imaging signals, and downsampling the frequency encoded imaging signals by an integer downsampling factor. The frequency encoded imaging signals are resampled by a resampling factor substantially equal to the integer upsampling factor divided by the integer downsampling factor.

21 Claims, 7 Drawing Sheets

SYSTEM AND METHOD FOR FILTERING FREQUENCY ENCODED IMAGING SIGNALS

BACKGROUND OF THE DISCLOSURE

The present specification relates to filtering frequency encoded imaging signals. More particularly, the present specification relates to filtering magnetic resonance imaging (MRI) signals.

In MRI systems, radio frequency (RF) signals are used in conjunction with magnetic fields to image areas of a patient. MRI measurements are divided into a period of RF excitation and a period of signal emission and acquisition. These measurements are performed in a cyclic manner in which the MRI measurement is repeated many times to accumulate different data during each cycle or to make the same measurement at different locations in the subject. A wide variety of preparative excitation techniques are known which involve the application of one or more RF excitation pulses of varying magnitude, frequency content, phase and duration. Such RF excitation pulses may have a narrow frequency spectrum (selective excitation pulse), or they may have a broad frequency spectrum (nonselective excitation pulse) which can produce transverse magnetization over a range of resonant frequencies. The prior art is replete with RF excitation techniques that are designed to take advantage of particular MRI phenomena.

After an excitation pulse, the MRI system receives the RF signals emitted by the excited nuclei and uses these signals to construct an image of the patient. The received signals containing image information lie in a band of frequencies centered at the Larmor frequency. Before the image information can be extracted to construct an image of the patient (e.g., via Fast Fourier Transform or FFT), these signals are demodulated by shifting the frequencies of the signals to lower frequencies to improve the efficiency of the FFT. Conventional signal conversion is employed to shift the band of frequencies by mixing the image information signal with a reference signal. Unless properly filtered out, noise in a band of frequencies that is symmetrical about the reference signal frequency with the image information band will become superimposed onto the image information in the resultant signal produced by the heterodyning.

This problem can be avoided if quadrature receivers are used to bring the image information to baseband. The use of in-phase (I) and quadrature (Q) demodulation allows frequencies on either side of a reference frequency to be distinguished, if the phase and amplitude adjustment of the I and Q signal channels is exact.

From a noise immunity standpoint, it is advantageous to convert the image information signal into the digital domain as early in the processing as possible. Resampling or decimation of the MR data yields further improvements in the computational efficiency of the FFT's which is accomplished by digitally filtering the MR data to the frequency range of interest. Once filtered, the data set can be reduced by an amount proportional to the decreased bandwidth. For example, if the MR data has an initial bandwidth of 64 kHz and it is filtered to a bandwidth of 32 kHz, every other data point can be discarded, which corresponds to a proportional resampling factor of ½. One drawback of this simple downsampling approach is that proportional resamplings are limited to resampling factors having a numerator (i.e., upsampling factor) of one. Since the resampling factor determines the resolution at which the image can be displayed, what is needed is a system that provides additional flexibility in the resampling factor.

Accordingly, what is needed is an improved system and method for filtering frequency encoded imaging signals that allows resampling by substantially any rational, fractional resampling factor, including resampling factors having upsampling factors other than one. Further still, what is needed is a system and method for filtering frequency encoded imaging signals that provides resampling by substantially any rational, fractional resampling factor in the time domain. Further still, what is needed is a digital filter for filtering frequency encoded imaging signals that applies filter coefficients to MRI data in a more efficient manner. Further yet, what is needed is a system and method for filtering frequency encoded imaging signals that allows processing of a wider bandwidth signal, having more filter taps, which will in turn improve MR image quality. Further still, what is needed is a system and method for filtering frequency encoded imaging signals that provides more efficient sampling of the region of interest, improves resolution of the area of interest, provides full flexibility of filter bandwidth selection, and provides efficient reconstruction of critically sampled data by minimizing the computation required by the FFT reconstruction.

The teachings hereinbelow extend to those embodiments which fall within the scope of the appended claims, regardless of whether they accomplish one or more of the above-mentioned needs.

SUMMARY OF EXEMPLARY EMBODIMENTS

According to one exemplary embodiment, a method of filtering frequency encoded imaging signals includes receiving the frequency encoded imaging signals in the time domain and demodulating the frequency encoded imaging signals. The method further includes upsampling the frequency encoded imaging signals by an integer upsampling factor, reducing the bandwidth of the frequency encoded imaging signals, and downsampling the frequency encoded imaging signals by an integer downsampling factor. The frequency encoded imaging signals are resampled by a rational resampling factor substantially equal to the integer upsampling factor divided by the integer downsampling factor.

According to another exemplary embodiment, a digital filter for filtering magnetic resonance imaging (MRI) signals includes a quadrature demodulator, a filter, and a resampler. The quadrature demodulator is configured to receive the MRI signals and to demodulate the MRI signals. The filter is configured to reduce the bandwidth of the MRI signals. The resampler is configured to receive the MRI signals and to resample the MRI signals. The resampler operates in the time domain and is configured to resample the MRI signals based on a selected one of a plurality of fractional resampling factors having different upsampling integer factors.

According to yet another exemplary embodiment, a method of filtering frequency encoded imaging signals includes resampling the imaging signals by an integer upsampling factor (L) and an integer downsampling factor (M) and applying filter coefficients to the imaging signals to generate output signals having a reduced bandwidth. A first subset of the filter coefficients is applied to the imaging signals to generate a first output signal and a second subset of the filter coefficients is applied to the imaging signals to generate a second output signal.

BRIEF DESCRIPTION OF THE DRAWINGS

The invention will become more fully understood from the following detailed description, taken in conjunction with the accompanying drawings, wherein like reference numerals refer to like parts, and in which.

DETAILED DESCRIPTION OF EXEMPLARY EMBODIMENTS

Figure 1:
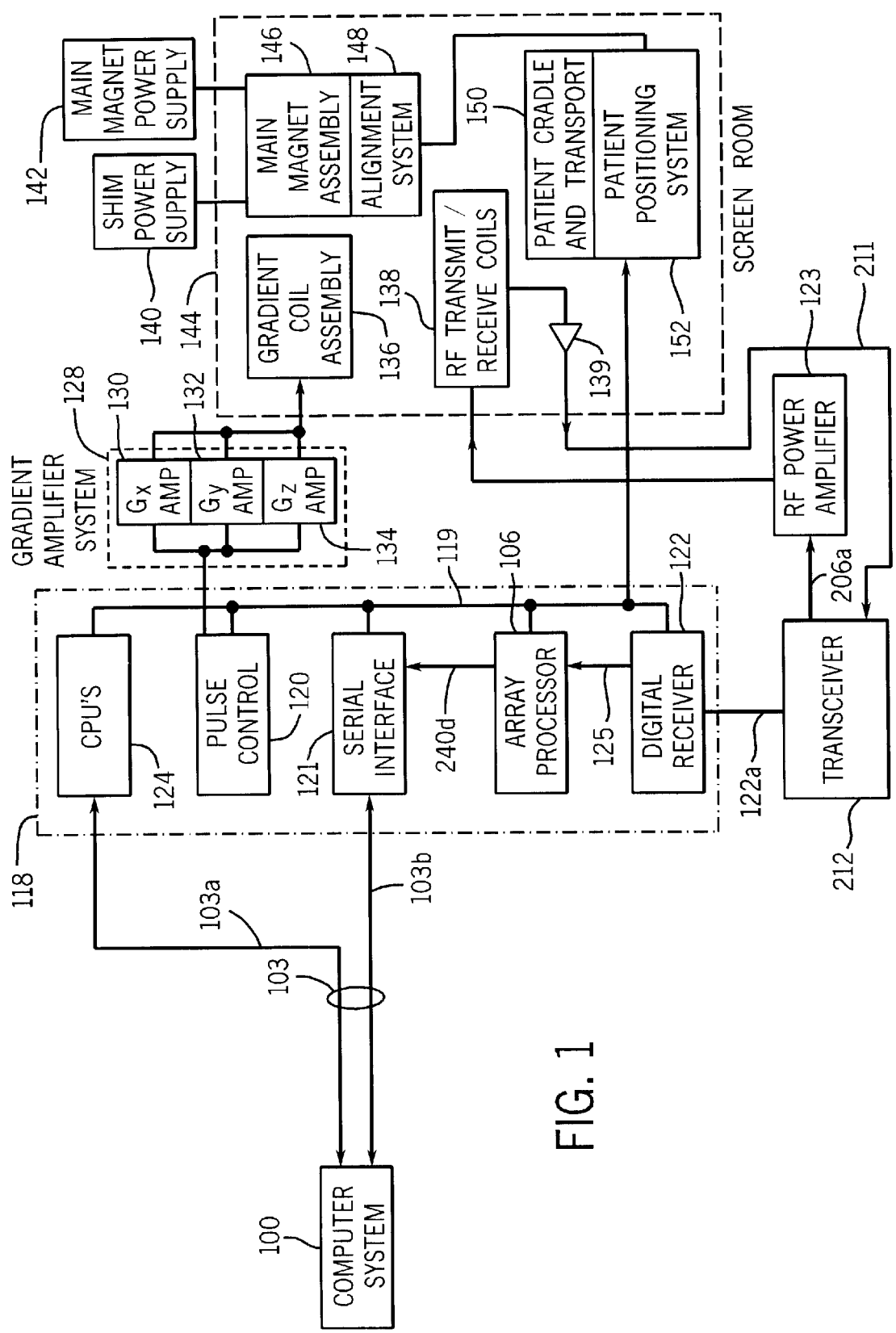
FIG. 1 is a block diagram of an MRI system, according to an exemplary embodiment.

Referring first to FIG. 1, there is shown in block diagram form an exemplary MRI system. The overall operation of the system is under the control of a computer system generally designated 100 which may be any type of computing apparatus, such as a Silicon Graphics workstation or Windows-based Intel PC. Computer system 100 provides interactive image display manipulation such as magnification, image comparison, gray-scale adjustment and real time data display. The MRI system may include one or more components similar to that disclosed in U.S. Pat. No. 4,992,736, which is hereby incorporated by reference.

Computer system 100 exercises control over the MRI system by an MR computer 118 and gradient amplifier system 128. Computer 100 communicates with MR computer 118 via a communication data link 103 including an Ethernet bus 103a and a serial fiber optic bus 103b. Bus 103a communicates command and status information and bus 103b communicates MRI data. MR computer 118 includes several subsystems including a pulse control device 120, an array processor 106, a digital receiver 122, one or more central processing units 124 (e.g., three CPUs is preferable), and a serial interface 121. Pulse control device 120 utilizes control signals provided by computer system 100 to generate digital timing and control signals such as the digital waveforms which control gradient coil excitation and the radio frequency (RF) envelope waveforms utilized in transceiver 212 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136 which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by a main magnet (not shown) is directed in the z direction and is termed $B_o$, and the total magnetic field in the z direction is referred to as $B_z$, then $G_x = \partial B_z / \partial x$, $G_y = \partial B_z / \partial y$ and $G_z = \partial B_z / \partial z$, and the magnetic field at any point (x, y, z) is given by $B(x, y, z)$ $B_o + G_x X + G_y Y + G_z Z$.

The gradient magnetic fields are utilized in combination with RF pulses generated by transceiver 212, RF power amplifier 123 and RF coil 138 to encode spatial information into the MRI signals emanating from the region of the patient being studied. Transceiver 212 is coupled to digital receiver 122 by a serial fiber optic bus 122a. Waveforms and control signals provided by pulse control device 120 are utilized by transceiver 212 for RF carrier modulation and mode control. In the transmit mode, the transmitter provides an RF waveform modulated in accordance with the control signals to an RF power amplifier 123 which then energizes RF coil 138 which is situated within main magnet assembly 146. The MRI signals radiated by the excited nuclei in the patient are sensed by the same or a different RF coil than is used for transmitting, which is coupled to transceiver 212 by a preamplifier 139. In this exemplary embodiment, the MRI signals produced by the patient are picked up by receiver coil 138B (FIG. 2) and applied to an input of a receiver/attenuator 207 within transceiver 212. Receiver/attenuator 207 amplifies the MRI signal. The MRI signals are amplified, demodulated, filtered, and digitized in the receiver section of transceiver 212. The MRI signals are then provided to a digital receiver 122 which processes the signals according to one of the methods described below with reference to FIGS. 5 and 6. The processed MRI signals are transmitted to array processor 106 for processing (e.g., by Fast Fourier Transform or FFT). A databus 119 is coupled between central processing units 124 and pulse control 120, serial interface 121, array processor 106, and digital receiver 122. Digital receiver 122 also includes a high-speed bus 125 coupled to array processor 106. A dedicated databus 240d couples array processor 106 to serial interface 121.

The received MRI signal contains patient image information within a 500 kHz band (or 1 MHz, or other band) of frequencies centered at or around the Larmor frequency, which in this exemplary embodiment is 63.86 MHz. The image information of interest typically lies in a narrower band within this 500 kHz band of frequencies. The received high frequency signal is demodulated and filtered with a band pass filter in a demodulator/filter 208. In particular, the signal is a band limited signal with a center frequency of 2.25 MHz and a bandwidth of +/−250 kHz about this center frequency. The signal is then applied to the input of an analog-to-digital (A/D) converter 240a which samples and digitizes the analog signal at a rate of 1 MHz (or 2 MHz in the 1 MHz band example).

The Shannon Sampling Theorem states that the sampling rate must be at least twice the bandwidth of the analog signal. If this is not done, some frequency components of the analog signal may be superimposed, i.e. will be indistinguishable from each other in the sampled data. This phenomenon is called "aliasing". When applied to analog signals, (e.g. a lowpass signal with frequency content from 0 to $f_o$), this Theorem dictates that the sampling rate be at least twice the highest frequency present (i.e. a sampling rate of $2f_o$). However, in the present band-pass case, with a bandwidth equal to $f_o$, the sampling rate need not exceed $2f_o$, if the sampling frequency $f_s$ and the center frequency $f_c$ of the band limited signal is chosen properly.

Figure 2:
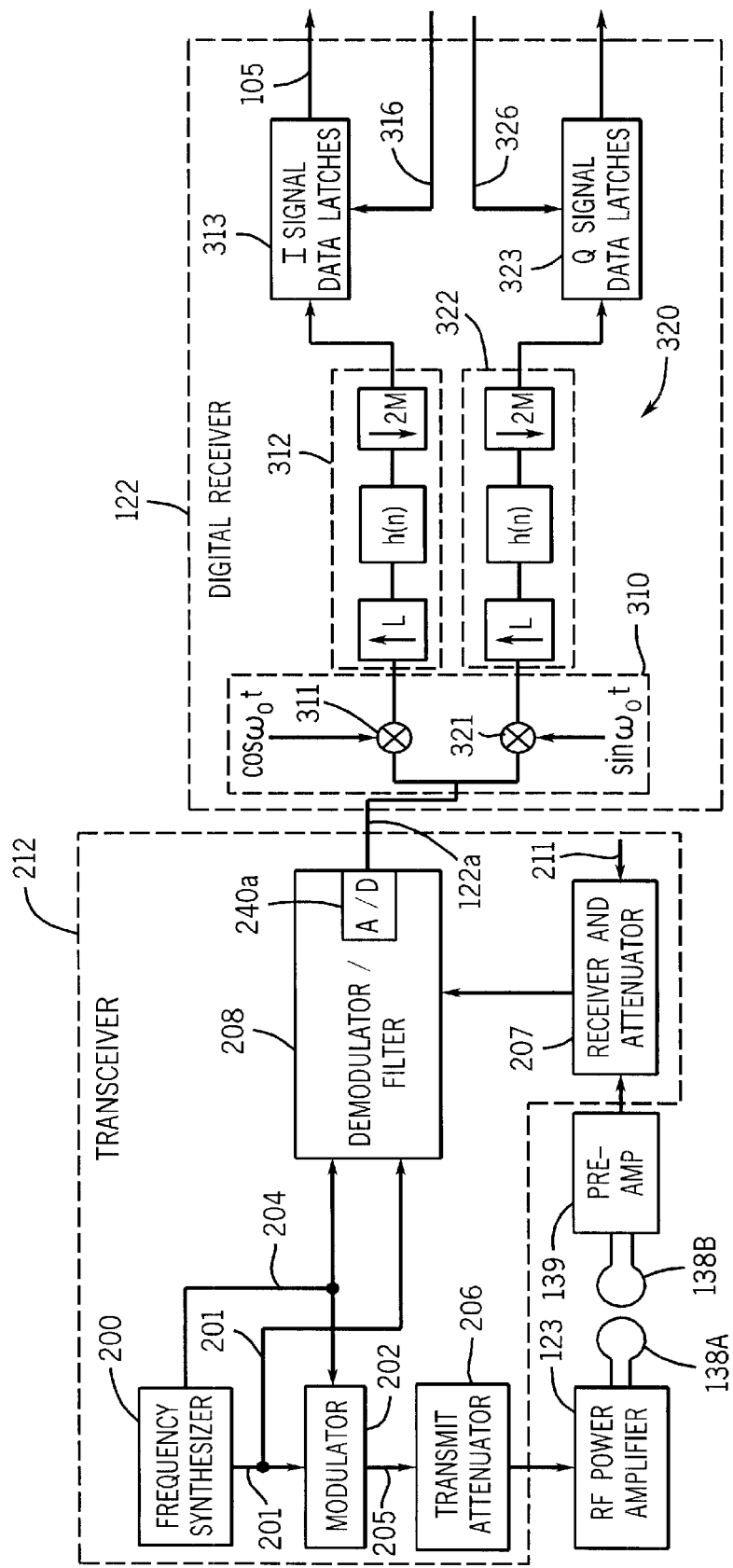
FIG. 2 is a block diagram of a transceiver and digital receiver in the MRI system of FIG. 1, according to an exemplary embodiment.
Figure 3A:
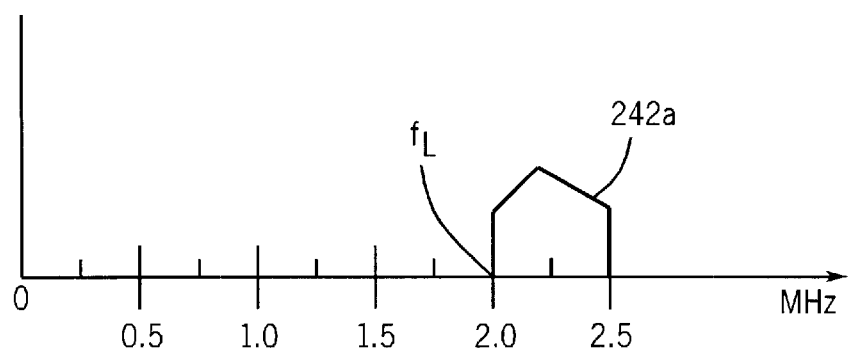
FIGS. 3A–4B are waveforms of the received MRI signals at different stages of processing.
Figure 3B:
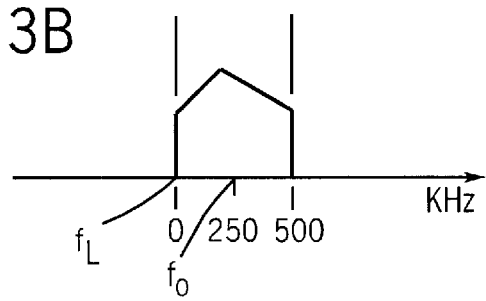

A/D converter 240a is configured to undersample the signal to use aliasing as illustrated by the resulting frequency spectrum in FIG. 3B. The signal is sampled at twice the frequency of the bandwidth of the band limited signal 242a (500 kHz×2=1 MHz). Because the band limited signal's 242a lowest frequency $f_L$ is at 2.0 MHz, aliasing occurs. The aliased digitized signal is effectively shifted from $f_L$=2 MHz to $f_L$=0 MHz. The output of the A/D converter is applied to a digital receiver 122 (FIG. 2).

Demodulator/filter 208 can include a bandpass filter with a center frequency at 2.25 MHz and having an amplitude response of ±0.5 dB throughout a 500 kHz band extending evenly across both sides of the center frequency and a 50 dB rejection of frequencies below and above the cutoff frequencies.

Although the real signal which results from the processing in demodulator/filter 208 could be used directly by array processor 106 to construct an image, it is desirable to derive two standard quadrature signals (I and Q) containing the image information in order that the FFT can be performed efficiently. Thus, digital receiver 122 is configured to demodulate the demodulated and filtered signal (comprising a plurality of image information samples) to produce a 32-bit in-phase (16-bit, etc.) (I) value and a 32-bit quadrature (Q) value. The resulting stream of digital I and Q values of the received MRI signal is output through data link 125 to array processor 106 where the values are reconstructed into an image.

Figure 4A:
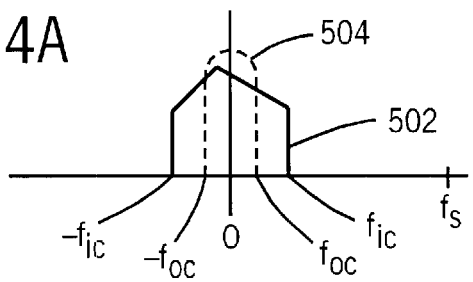
Figure 5:
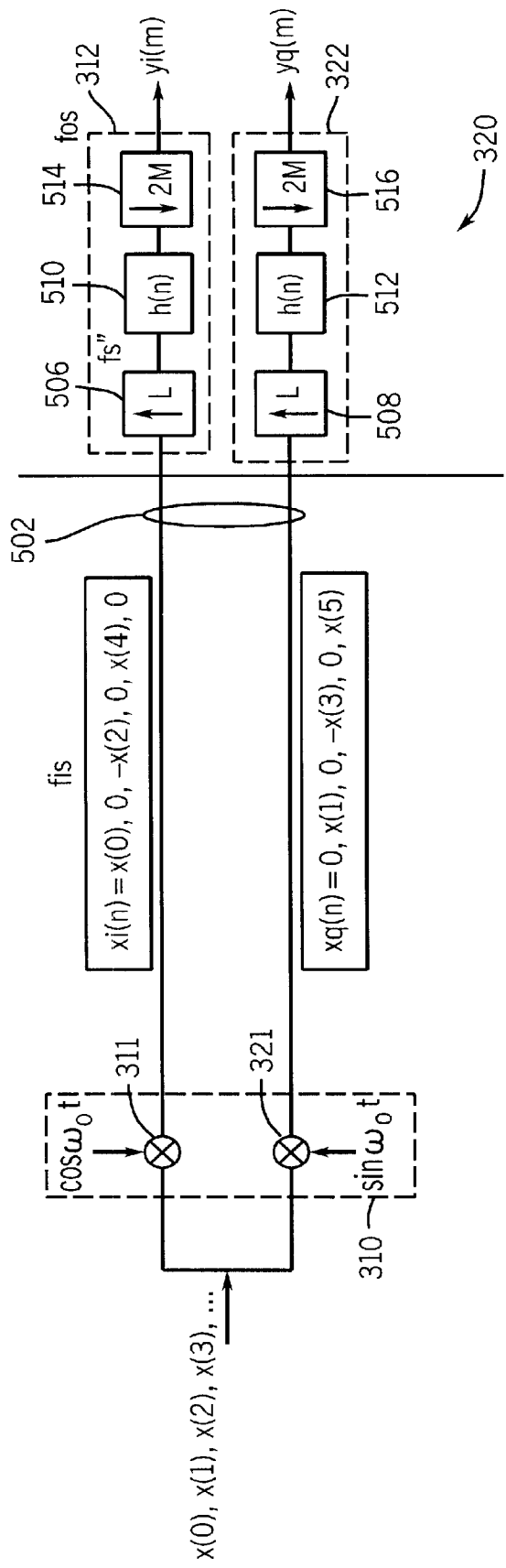
FIG. 5 is a block diagram of a demodulator and filter, according to an exemplary embodiment.

Referring now to FIG. 5, demodulation circuit 310 includes quadrature demodulators 311 and 321 which receive image information samples in the time domain and produce the I (in phase) and Q (quadrature) components from the image information samples (FIG. 3B). Demodulation circuit 310 also brings the mid-frequency (250 kHz) of the signal down to DC level (i.e., zero Hertz, as illustrated in FIG. 4A). As indicated at signal spectrum 502 (FIG. 4A), the imaging signals have a center frequency $f_o$, a bandwidth of $2f_{ic}$, and a sampling frequency of $f_s$. $f_o=\frac{1}{4} f_s$.

The classical quadrature detection technique involves separately mixing every image information sample from demodulator/filter 208 with sine and cosine reference signals at the 250 kHz mid-band frequency. Since the sampling rate of A/D converter 240a for the image information samples is 1 MHz, the sine and cosine reference signals must also be sampled at that rate to provide digital values by which to multiply the image information samples. The sampling frequency of A/D converter 240a (1 MHz) is four times the frequency of the sine and cosine reference signals (250 kHz) and has a phase relationship which produces the following series of digital values for the cosine and sine reference signals:

cosine: 1, 0, −1, 0, 1, 0, −1, 0, . . .
sine: 0, 1, 0, −1, 0, 1, 0, −1, . . .

The sampling frequency of four times the sine and cosine reference signals is selected to minimize computation in subsequent steps. FIG. 4A illustrates the digitized signals after quadrature demodulation.

As can be observed from these numerical series, when the image information samples are multiplied by the cosine and sine reference signals, every other product or term in the resultant I and Q samples will be zero. As a consequence, part of the quadrature detection can easily be implemented by a pair of gates which alternate passing every other image information sample, recognizing that the interleaved zero terms are not present in the gated outputs. That is, when the "I" gate is open to pass an image information sample, the "Q" gate is closed, and vice versa. However, every fourth term of both the sine and cosine numerical series is a negative one, which means that every other time that each gate is opened the sample should be inverted, or negated in digital terminology.

More particularly, the image information samples from demodulator/filter 208 are applied to the inputs of demodulation circuit 310 comprising two mixers 311 and 321. Mixer 311, designated as the I gate, mixes digitized MRI signals with a clock signal cos $\omega_o t$. Mixer 321, designated as the Q gate, mixes the MRI signals with a clock signal sin $\omega_o t$. cos $\omega_o t$ and sin $\omega_o t$ are 250 kHz signals in quadrature. The outputs of mixers 311 and 321 are coupled respectively to separate finite impulse response (FIR) digital filters 312 and 322 in a filter circuit 320.

Demodulation circuit 310 is a quadrature demodulator in this exemplary embodiment configured to mix the imaging signals, comprising I and Q components, with reference signals (cos $\omega_o t$ and sin $\omega_o t$) in quadrature with one another. The input signal x(n)={x(0), x(1), x(2), . . . }. The demodulated signals are $x_i(n)$ and $x_q(n)$, which are represented as:

$x_i(n)$=x(0), 0, −x(2), 0, x(3), 0, . . .

$x_q(n)$=0, x(1), 0, −x(3), 0, x(5), . . .

Filter circuit 320 is configured to receive the demodulated signals $x_i(n)$ and $x_q(n)$ and to produce output signals $y_i(m)$ and $y_q(m)$ based on filters 312 and 322, respectively. Filter circuit 320 is configured to reduce the bandwidth of the imaging signals, for example via lowpass filtering, and to resample the imaging signals, all in the time domain. Advantageously, the amount of data in the imaging signals is reduced to only an amount of data necessary to display the image with the desired image size (e.g., image width in millimeters) on a display of computer system 100 (FIG. 1). Filter circuit 320 performs a convolution of the demodulated signals $x_i(n)$ and $x_q(n)$ with a plurality of filter coefficients h(n).

Performing the filtering in the time domain provides several advantages. The imaging signals can be filtered as they are received and demodulated, rather than frequency domain filtering which requires a plurality of segments of data to be acquired and, consequently, delayed before being processed. The time domain filtering of this exemplary embodiment also provides greater flexibility in resampling ratios and a simpler filtration algorithm.

The bandwidth of the imaging signals is reduced by lowpass filtering in this exemplary embodiment. Advantageously, the bandwidth of the imaging signals is reduced to the frequency range of interest. By eliminating imaging signals outside of the frequency range of interest, subsequent reconstruction by FFT can be expedited.

Filter circuit 320 is further configured to resample the imaging signals by upsampling (i.e., interpolating) the imaging signals by an integer upsampling factor L and downsampling (i.e., decimating) the frequency encoded imaging signals by an integer downsampling factor M. This resampling step allows the imaging signals to be fractionally resampled in the time domain by substantially any rational, fractional resampling factor L/M equal to the integer upsampling factor L divided by the integer downsampling factor M. The rational resampling factor L/M can be any rational fractional number, such as, ⅔, ¾, ⅘, 5/16, etc. Notably, both the upsampling factor (i.e., the numerator) and the downsampling factor (i.e., the denominator) of the fractional resampling factor can be any integer number, such as 1, 2, 3, 4, etc. Thus, filter circuit 320 can be configured to resample the MRI signals based on a selected one of a plurality of fractional resampling factors having different integer upsampling factors and/or different integer downsampling factors. The resampling step allows computer system 100 (FIG. 1) to represent the image encoded in the imaging signals with greater flexibility. For example, a 10 cm by 10 cm square image of an area of interest on a patient can be magnified or zoomed to not only ½, ⅓, and ¼ (i.e., corresponding to downsampling factors of 2, 3, and 4, respectively) the image size, but also ⅔, ¾, 4/9, etc. In various exemplary embodiments, subsets of all rational, fractional resampling factors may be available to an operator.

Figure 4B:
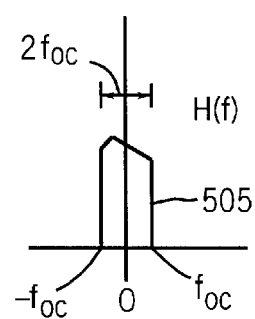

As illustrated in FIG. 5, resampling steps 506 and 508 resample demodulated signals $x_i(n)$ and $x_q(n)$ by upsampling factor L to generate resampled signals having a corresponding sampling frequency fs"=L*fs. Filtering steps 510 and 512 reduce the bandwidth of the imaging signals. Downsampling steps 514 and 516 downsample the filtered signals by downsampling factor 2M to generate downsampled signals. Filter circuit 320 generates a filtered signal waveform 505 having a bandwidth of $2f_{oc}$ centered at zero, as illustrated in FIG. 4B.

Advantageously, the integer resampling factors L and M are reduced by d, the most common divider. Thus:
d=most common divider of L and 2M, L'=L/d, M'=2M/d;
e.g., L/2M=⅙==>L'/M'=⅔ d=2
  L'=2
  M'=3
h(n)=FIR(L', M', Q);

As illustrated in FIG. 5, filtering steps 510, 512 are defined by filter coefficients h(n), and are illustrated as waveform 504 in FIG. 4A. h(n) is a finite impulse response (FIR) filter in this exemplary embodiment with Q taps and a cutoff frequency, $f_{oc}$, less than $L'/M'^* f_{ic}$, which prevents aliasing in the final dowsampled signal.

One exemplary form of the filter equations for filter 320 is set forth below. In this and subsequent discussions, reduced versions of L and M are presumed.

$$y_i(m) = \sum_{n=0}^{Q-1} h(nL + (m2M\%L))x_i(\lfloor m2M/L \rfloor - n) \quad (1)$$

$$y_q(m) = \sum_{n=0}^{Q-1} h(nL + (m2M\%L))x_q(\lfloor m2M/L \rfloor - n) \quad (2)$$

where L is the upsampling rate and M is the downsampling rate.

$$Q = N\_tap/L \quad (3)$$

H(f) is the Discrete Fourier Transform of h(n)

$$H(f) = \mathcal{F}\{h(n)\} \quad (4)$$

The following is a frequency domain description of filter 320 with cutoff described by equation (5) and illustrated in FIG. 4B.

$$H(f) = \begin{cases} 1 & -foc < f < foc \\ 0(\text{approx.}) & \text{Otherwise} \end{cases} \quad (5)$$

where h(n), the filter coefficients, are (in one embodiment) a sinc function with frequency $f_{oc}$ truncated to N_tap's with a hamming window applied:

$$h[n]=\text{hamming\_window}[n]*sinc(2\pi f_{oc} n) \text{ truncated to N\_tap } (\pm N\_tap/2) \quad (6)$$

The filter coefficients can take many alternative forms.

Filters 312, 322 serve as resamplers as well as lowpass filters in this exemplary embodiment and are thus a unified filtered coefficient set in a single filter. Thus, each of L filters of length Q both resamples and lowpass filters a set of input data $x_i(n)$ and $x_q(n)$. All of the filters have the same magnitude response, but subsequent filters each have an additional time delay or phase response of Δt/L, 2Δt/L, etc., up to the number of filters L, where Δt=1 μsec for a 500 kHz bandwidth (i.e., $f_s$=1 MHz). Δt is the sampling interval equal to $1/f_s$. Stated another way, output signals $y_i(m)$ and $y_q(m)$ are calculated by a lowpass filter with Q×L coefficients to accommodate for the resampling function. For each new input datapoint $x_i(n)$ and $x_q(n)$, N_taps/L=Q calculations are performed based on L different groups of coefficients from the filter that are interlaced in the filter equations (1) and (2). L and M are used to index h(n) and x(n) to produce output functions $y_i(m)$ and $y_q(m)$. This implementation provides optimal efficiency in terms of data storage and number of calculations.

Figure 6:
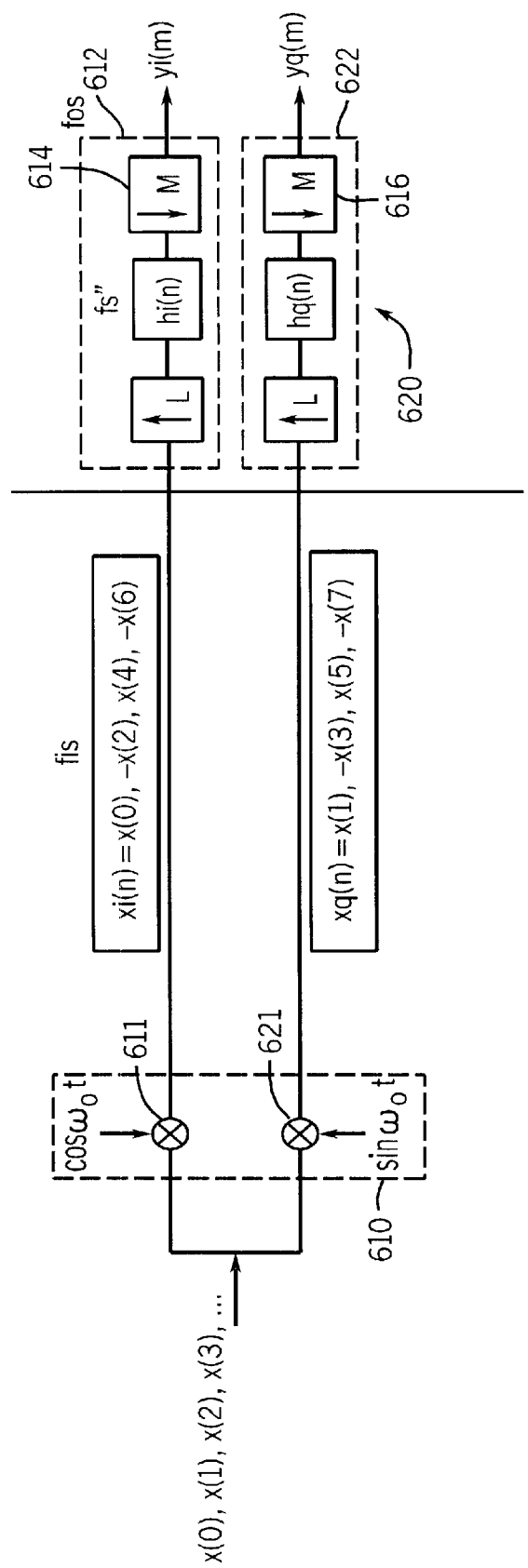
FIG. 6 is a block diagram of a demodulator and filter, according to another exemplary embodiment.

In the embodiment of FIG. 5, quadrature demodulated signals $x_i(n)$ and $x_q(n)$ include zero-multiplied data in every other data point. In the embodiment of FIG. 6, demodulation circuit 610 removes the zero-multiplied data. Demodulation circuit 610 is a demodulator only in this exemplary embodiment and is configured to mix the imaging signals, comprising I and Q components, with a reference signal (cos $\omega_o t$) at mixers 611 and 621. Quadrature phase adjustments are performed by $h_i(n)$, $h_q(n)$ in filter 620. A critically sampled real imaging signal is sampled at twice the highest frequency component of the imaging signal (in the frequency range of interest) to satisfy the Nyquist criterion. A critically sampled complex imaging signal is sampled at the highest frequency component of the imaging signal to satisfy the Nyquist criterion, because each complex point includes a real data component and an imaginary data component. Thus, demodulated signals $x_i'(n)$ and $x_q'(n)$ are represented as:

$x_i'(n)=x(0), -x(2), x(4), \ldots$
$x_q'(n)=x(1), -x(3), x(5), \ldots$

Filter circuit 620 is configured to receive the demodulated signals $x_i(n)$ and $x_q(n)$ and to apply filters 612, 622 to the demodulated signals. Filters 612, 622 are configured to reduce the bandwidth of the imaging signals, for example via lowpass filtering, and to resample the imaging signals, all in the time domain to produce the output signal indicated in FIG. 4B. The downsampling ratios of steps 614 and 616 can be simplified from 2M in the embodiment of FIG. 5 to M in the embodiment of FIG. 6. Output functions $y_i(m)$ and $y_q(m)$ can be derived as follows:

Since $x_i(n)=0$ at every odd samples, setting n=2k, Eq.(1) becomes $$y_i(m) = \sum_{k=0}^{Q/2-1} h(2kL + (m2M\%L))x_i(\lfloor m2M/L \rfloor - 2k) \quad (7)$$

$$= \sum h(2(kL + (mM)\%L))x_i(2(\lfloor mM/L \rfloor - k))$$

Define $h_i(n)=h(2k)$ and $x_i'(n)=x_i(2k)$, so Eq.(7) becomes $$y_i(m) = \sum_{n=0}^{Q/2-1} h_i(nL + (mM\%L))x_i'(\lfloor mM/L \rfloor - n) \quad (8)$$

where $h_i(n)$ can be divided into L sets of coefficients $$g_{ij}=h_i(nL+(jM\%L))  j=0, 1, \ldots L-1 \quad (9)3$$

Similarly, since $x_q(n)=0$ at every odd sample, set n=2k+1, define $h_q(n)=h(2k+1)$, and $x_q'(n)=x_q(2k+1)$, so Eq.(2) becomes $$y_q(m) = \sum_{n=0}^{Q/2-1} h_q(nL + (mM\%L))x'_q(\lfloor mM/L \rfloor - n) \quad (10)$$

where $h_q$ can be divided into L sets of coefficients $$g_{qj} = h_q(nL + (jM\%L)) j = 0, 1, \ldots, L-1 \quad (11)$$

Eqs. (8) and (10) are the filter equations for the combined demodulation and multirate filter system.

One exemplary implementation of output functions $y_i(m)$ or $y_q(m)$ based on equations (8) or (10) will now be described to illustrate the indexing of the filter coefficients, where:

h( ) is either $h_i$ or $h_q$,
x( ) is either $x_i$ or $x_q$, and
y( ) is either $y_i$ or $y_q$,
collectively.
L=2
M=3
N_tap=16
Q=N_tap/L=8

```
m = 0    n = 0
            h(0 + (0)) × (0 − 0)
            h(0) × (0)
         n = 1
            h(2 + (0)) × (0 − 1)
            h(2) × (−1)
         n = 2
            h(4 + 0) × (0 − 2)
            h(4) × (−2)
         n = 3
            h(6 + 0) × (0 − 3)
            h(6) × (−3)
            y(0) = h(0) × (0) + h(2) × (−1) + h(4) × (−2) + h(6) × (−3)
m = 1    n = 0
            h(0 + 3%2) × (⌊1 · 3/2⌋ − 0)
            h(1) × (1)
         n = 1
            h(2 + 3%2) × (1 − 1)
            h(3) × (0)
         n = 2
            h(4 + 3%2) × (1 − 2)
            h(5) × (−1)
         n = 3
            h(6 + 3%2) × (1 − 3)
            h(7) × (−2)
            y(1) = h(1) × (1) + h(3) × (0) + h(5) × (−1) + h(7) × (−2)
m = 2    n = 0
            h(0 + 2 * 3%2) × (2 * 3/2 − 0)
            h(0) × (3)
         n = 1
            h(1 * 2 + 2 * 3%2) × (2 * 3/2 − 1)
            h(2) × (2)
         n = 2
            h(2 × 2 + (2 * 3%2)) × (2 * 3/2 − 2)
            h(4) × (1)
         n = 3
            h(6) × (0)
            y(3) = h(0) × (3) + h(2) × (2) + h(4) × (1) + h(6) × (0)
```

Thus, for a given set x(−i) ... x(−1), x(0), x(1), ... x(i) input samples, interleaved set of Q coefficients=h(0), h(2), h(4) ... is applied to the samples to generate a first output signal and a second and final (L=2) set of filter coefficients h(1), h(3), h(5) ... is applied to the samples to generate the delayed (or interpolated) second output signal. In other words, the input samples are filtered L times before a next imaging sample is shifted into the filter.

Figure 7:
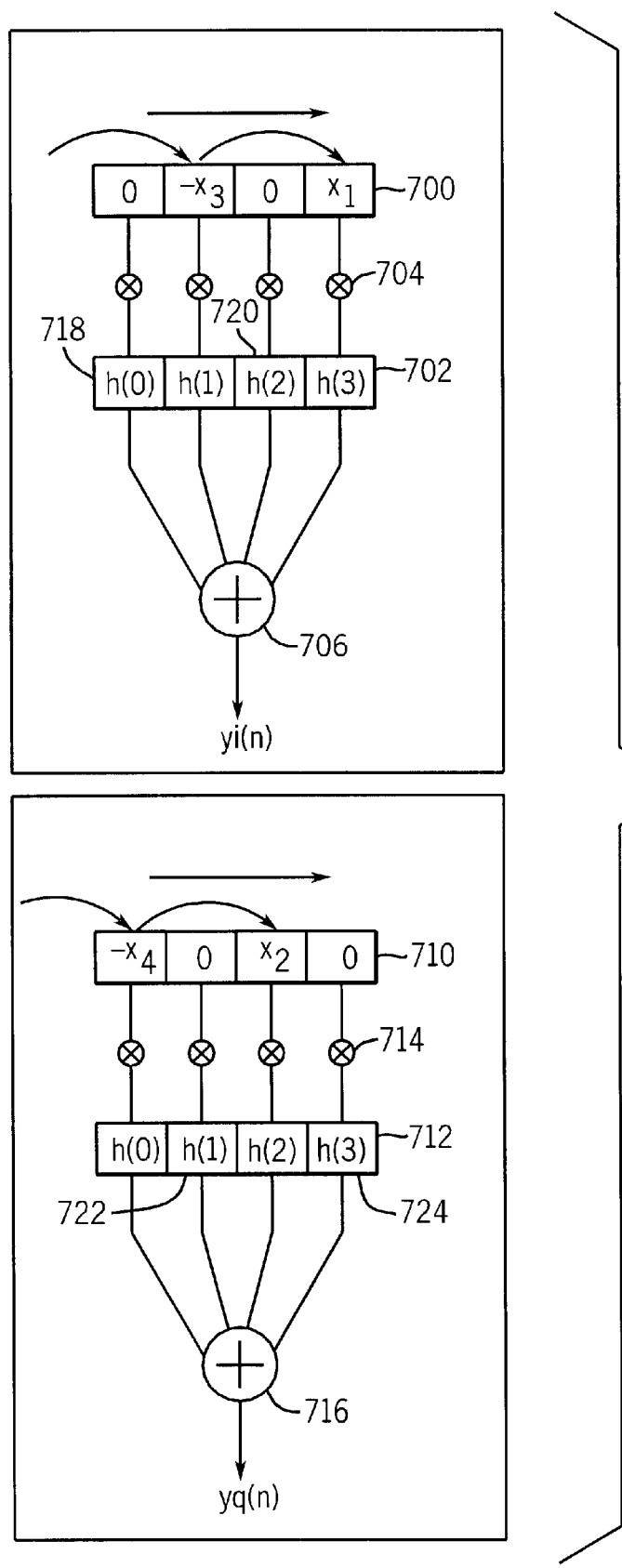
FIG. 7 is a schematic diagram of imaging signals and filter coefficients, according to an exemplary embodiment.
Figure 8:
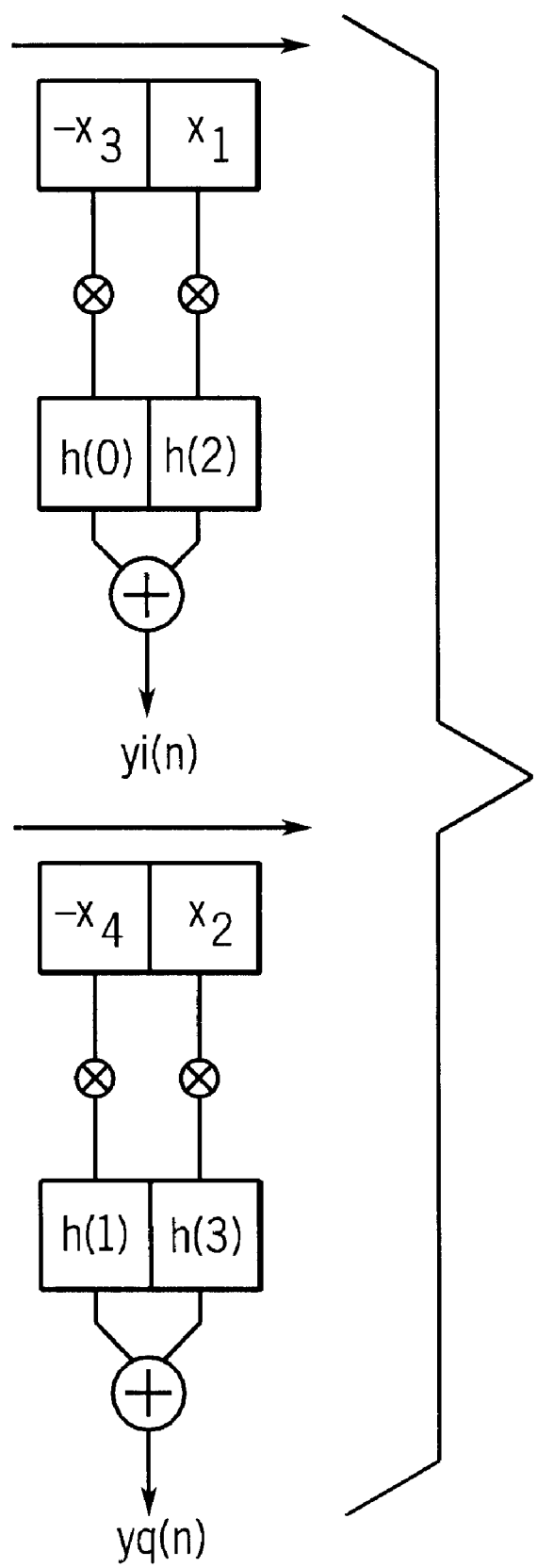
FIG. 8 is a schematic diagram of imaging signals and filter coefficients, according to another exemplary embodiment.

FIGS. 7 and 8 illustrate one aspect of equations (8) and (10) that simplifies the computations of the filter equations to arrive at output signals $y_i(m)$ and $y_q(m)$. FIG. 7 illustrates an input imaging signal buffer 700 in which data are shifted from left to right in steps of two. A filter coefficient buffer 702 remains constant. Buffers 700 and 702 are multiplied 704 and summed 706 to generate a single real output data $y_i(n)$. Similarly, a single, imaging output data is generated by buffers 710, 712, multiplication 714 and summation 716. Notably, every other filter coefficient is multiplied by zero (see points 718, 720, 722, 724). Accordingly, equations (8) and (10) index the input data $x_i(n)$ and $x_q(n)$ to eliminate these zeroed products, resulting in the simplified summation illustrated in FIG. 8.

The embodiments of FIG. 5 and FIG. 6 provide a greater flexibility in the bandwidths of imaging signals that can be viewed, since any rational fractional resampling factor is possible. Also, the embodiments of FIG. 5 and FIG. 6 allow filtering with a large number of coefficients Q, which allows higher bandwidths of imaging signals to be processed. Furthermore, only critically sampled data is reconstructed, leading to a more efficient Fourier Transform.

According to an alternative embodiment, a resampling filter is configured to create delays using L sets of coefficients, differing in their response by kΔt/L, where k=1 ... L−1, followed by a lowpass filter.

According to another alternative embodiment, the output functions described above in the various embodiments may be sorted into their constituent elements to implement L filter banks.

While the exemplary embodiments illustrated in the FIGS. and described above are presently preferred, it should be understood that these embodiments are offered by way of example only. For example, various alternative filter coefficient equations may be utilized. Furthermore, the steps of upsampling, lowpass filtering, and downsampling may be performed in any order, or simultaneously, depending upon the form of the algorithms used. Further still, while exemplary filters have been described with equations using specific letters representing variables and terms, the equations could be written using different letters to represent variables and terms, and these variables and terms could be grouped differently, simplified, etc., without departing from the scope of the disclosure. Accordingly, the present invention is not limited to a particular embodiment, but extends to various modifications that nevertheless fall within the scope of the appended claims.

What is claimed is:

1. A method of filtering frequency encoded imaging signals having a bandwidth, the frequency encoded imaging signals used to reconstruct an image, comprising:

receiving the frequency encoded imaging signals in the time domain;

demodulating the frequency encoded imaging signals in the time domain;

upsampling the frequency encoded imaging signals in the time domain by an integer upsampling factor;

reducing the bandwidth of the frequency encoded imaging signals in the time domain; and downsampling the frequency encoded imaging signals in the time domain by an integer downsampling factor, whereby the frequency encoded imaging signals are resampled by a resampling factor substantially equal to the integer upsampling factor divided by the integer downsampling factor.

2. The method of claim 1, wherein a single filter performs the steps of upsampling, reducing the bandwidth, and downsampling.

3. The method of claim 2, wherein the single filter uses the integer upsampling factor and the integer downsampling factor to index a plurality of filter coefficients and the frequency encoded imaging signals.

4. The method of claim 2, wherein the single filter is defined by equations having the form $$y_i(m) = \sum_{n=0}^{Q/2-1} h_i(nL + (mM\%L))x_i(\lfloor mM/L \rfloor - n); \text{ and}$$

$$y_q(m) = \sum_{n=0}^{Q/2-1} h_q(nL + (mM\%L))x'_q(\lfloor mM/L \rfloor - n)$$

where the filter coefficients $h_i$ and $h_q$ are defined as $h_i(1)$, $h_i(2) \ldots h_i(L)$ and $h_q(1)$, $h_q(2) \ldots h_q(L)$.

5. The method of claim 2, wherein the single filter is defined by equations having the form:

$$y_i(m) = \sum_{n=0}^{Q-1} h(nL + (m2M\%L))x_i(\lfloor m2M/L \rfloor - n); \text{ and}$$

$$y_q(m) = \sum_{n=0}^{Q-1} h(nL + (m2M\%L))x_q(\lfloor m2M/L \rfloor - n).$$

6. The method of claim 1, wherein the step of reducing the bandwidth includes lowpass filtering the frequency encoded imaging signals.

7. The method of claim 1, wherein the frequency encoded imaging signals are filtered L times before a next imaging sample is shifted into the filter.

8. A digital filter for filtering magnetic resonance imaging (MRI) signals used to reconstruct an image, comprising:
    a quadrature demodulator configured to receive the MRI signals and to demodulate the MRI signals, wherein the quadrature demodulator operates in the time domain;
    a filter configured to reduce the time domain bandwidth of the MRI signals; and
    a resampler configured to receive the MRI signals and to resample the MRI signals, wherein the resampler is configured to resample the MRI signals based on a selected one of a plurality of fractional resampling factors having different integer upsampling factors, wherein the resampler operates in the time domain.

9. The digital filter of claim 8, wherein the resampler is configured to resample the MRI signals based on substantially any rational, fractional resampling factor.

10. The digital filter of claim 8, wherein the filter and resampler are implemented by a device defined by a single filter equation.

11. The digital filter of claim 10, wherein the single filter equation is defined by equations having the form:

$$y_i(m) = \sum_{n=0}^{Q-1} h(nL + (m2M\%L))x_i(\lfloor m2M/L \rfloor - n); \text{ and}$$

$$y_q(m) = \sum_{n=0}^{Q-1} h(nL + (m2M\%L))x_q(\lfloor m2M/L \rfloor - n).$$

12. The digital filter of claim 10, wherein the single filter equation configures the device to lowpass filter the MRI signals.

13. The digital filter of claim 12, wherein the single filter equation configures the device to use the integer upsamplmg factor and the integer downsampling factor to index a plurality of filter coefficients and the MRI signals.

14. The digital filter of claim 13, wherein the MRI signals are shifted through the filter and resampler, wherein the MRI signals are filtered L times between each shift.

15. The digital filter of claim 12, wherein the filter is defined by the equations having the form:

$$y_i(m) = \sum_{n=0}^{Q/2-1} h_i(nL + (mM\%L))x'_i(\lfloor mM/L \rfloor - n); \text{ and}$$

$$y_q(m) = \sum_{n=0}^{Q/2-1} h_q(nL + (mM\%L))x'_q(\lfloor mM/L \rfloor - n).$$

16. A method of filtering frequency encoded imaging signals used to reconstruct an image, comprising:
    resampling the imaging signals in the time domain by an integer upsampling factor and an integer downsampling factor; and
    applying filter coefficients to the imaging signals in the time domain to generate output signals having a reduced bandwidth, wherein a first subset of the filter coefficients is applied to the imaging signals to generate a first output signal and a second subset of the filter coefficients is applied to the imaging signals to generate a second output signal.

17. The method of claim 16, wherein the first subset of filter coefficients includes all even-numbered filter coefficients and the second subset of filter coefficients includes all odd-numbered filter coefficients.

18. The method of claim 16, wherein the filter coefficients lowpass filter the imaging signals.

19. The method of claim 16, further comprising demodulating the imaging signals into in-phase (I) and quadrature (Q) components.

20. The method of claim 16, wherein the steps of resampling and applying are performed according to the equations:

$$y_i(m) = \sum_{n=0}^{Q/2-1} h_i(nL + (mM\%L))x'_i(\lfloor mM/L \rfloor - n)$$

$$y_q(m) = \sum_{n=0}^{Q/2-1} h_q(nL + (mM\%L))x'_q(\lfloor mM/L \rfloor - n).$$

21. The method of claim 16, wherein the imaging signals are shifted through the filter coefficients and filtered L times between each shift, wherein L is the upsampling factor.

* * * * *